(12) United States Patent
Nakamura

(10) Patent No.: US 7,674,983 B2
(45) Date of Patent: Mar. 9, 2010

(54) WIRE HOLDER

(75) Inventor: Tatsuya Nakamura, Aichi-ken (JP)

(73) Assignee: Kitagawa Industries Co., Ltd., Aichi-Ken (JP)

( * ) Notice: Subject to any disclaimer, the term of this patent is extended or adjusted under 35 U.S.C. 154(b) by 0 days.

(21) Appl. No.: 12/185,894

(22) Filed: Aug. 5, 2008

(65) Prior Publication Data
US 2009/0038824 A1 Feb. 12, 2009

(30) Foreign Application Priority Data
Aug. 10, 2007 (JP) ............................. 2007-210287

(51) Int. Cl.
*H01B 17/16* (2006.01)
(52) U.S. Cl. .................. 174/168; 174/68.1; 174/97; 174/95; 174/135; 361/760; 248/49; 248/68.1
(58) Field of Classification Search ................. 174/168, 174/68.1, 97, 95, 135, 72 A, 64, 100; 361/760, 361/773, 809, 826; 248/49, 65, 68.1
See application file for complete search history.

(56) References Cited

U.S. PATENT DOCUMENTS

| | | | | |
|---|---|---|---|---|
| 2,527,442 A | * | 10/1950 | Odegaard | 174/159 |
| 4,611,868 A | * | 9/1986 | Matsui et al. | 439/590 |
| 5,417,400 A | * | 5/1995 | Arakawa | 248/323 |
| 6,600,107 B1 | * | 7/2003 | Wright et al. | 174/72 A |
| 6,865,087 B2 | * | 3/2005 | Jelinger | 361/756 |
| 7,223,918 B2 | * | 5/2007 | Gelibert | 174/95 |
| 7,316,374 B2 | * | 1/2008 | Maruyama | 248/68.1 |
| 7,532,484 B1 | * | 5/2009 | Sailor et al. | 361/773 |
| 7,533,853 B2 | * | 5/2009 | Ogawa | 248/74.1 |

FOREIGN PATENT DOCUMENTS

| | | |
|---|---|---|
| JP | 57 24787 | 2/1982 |
| JP | 2004 247357 | 9/2004 |

* cited by examiner

*Primary Examiner*—Dhiru R Patel
(74) *Attorney, Agent, or Firm*—Davis & Bujold, P.L.L.C.

(57) ABSTRACT

A wire holder includes a synthetic resin component that includes a clamp portion for holding at least one wire and a metal component that includes at least one lead portion mounted on a circuit board. The synthetic resin component includes a groove-shaped fitting groove portion. The metal component includes at least one fitting portion that fits the fitting groove portion and is connected to the lead portion. The fitting groove portion includes at least one first opening portion which allows the at least one lead portion to project in a predetermined direction when the at least one fitting portion fits the fitting groove portion. At least one of end portions in an extension direction of a groove of the fitting groove portion is opened as a second opening portion which allows one of the at least one lead portion to project along the extension direction of the groove of the fitting groove portion.

12 Claims, 6 Drawing Sheets

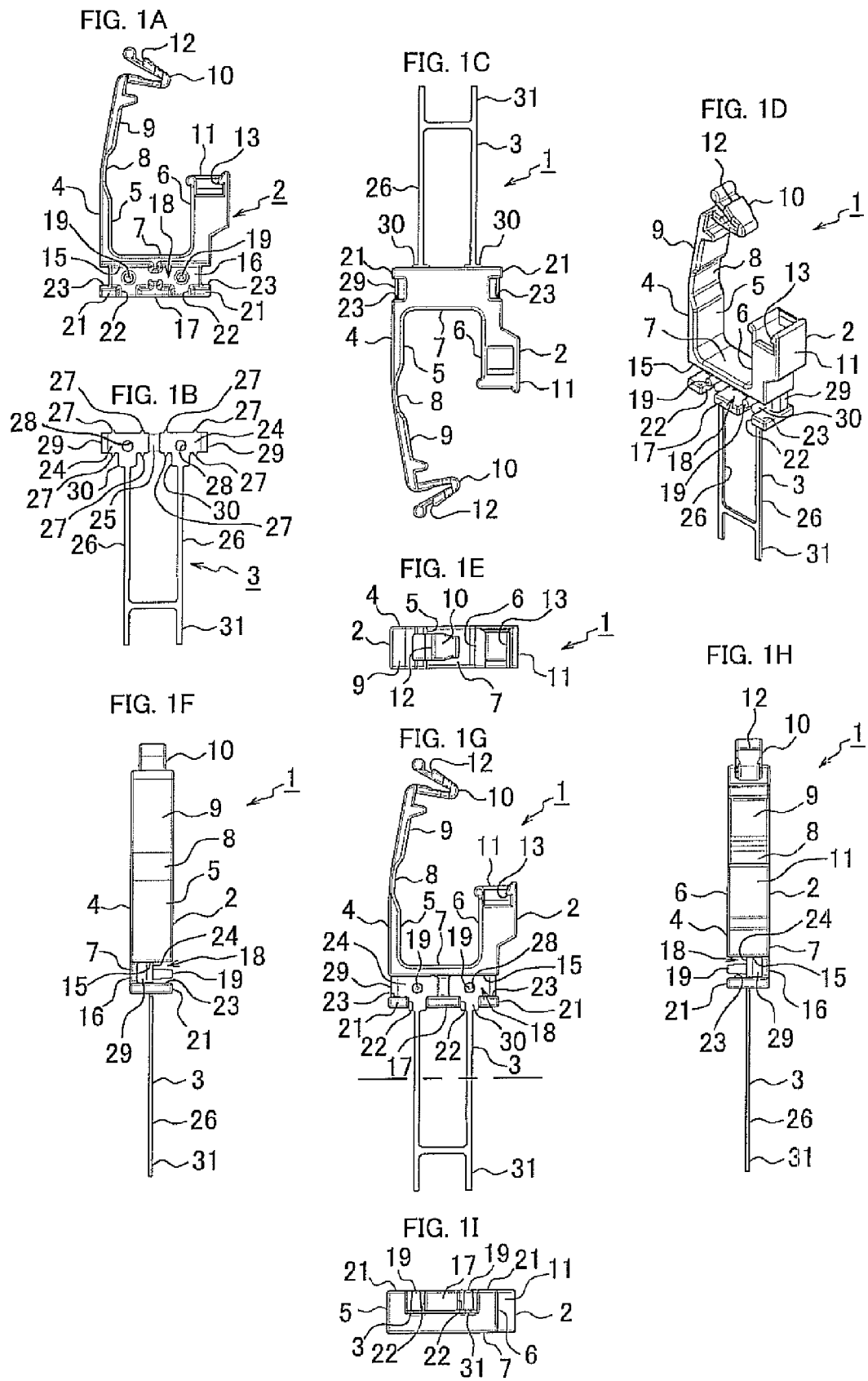

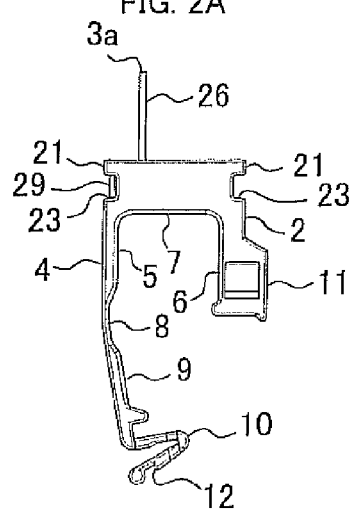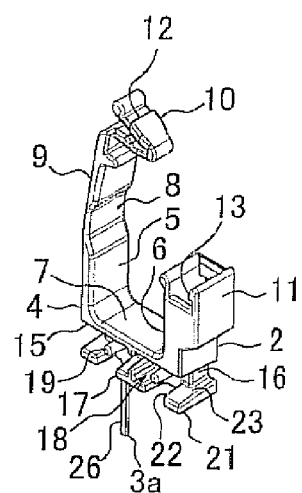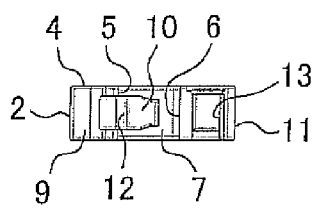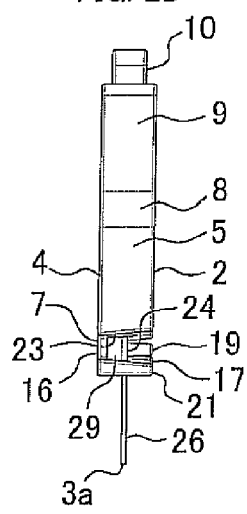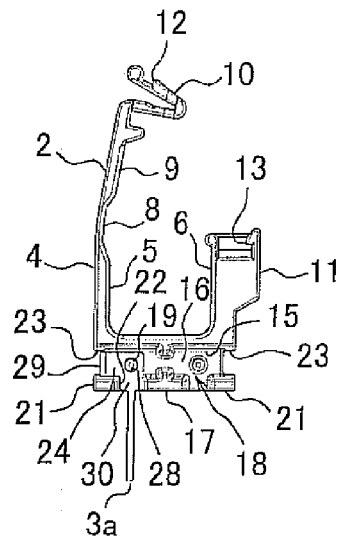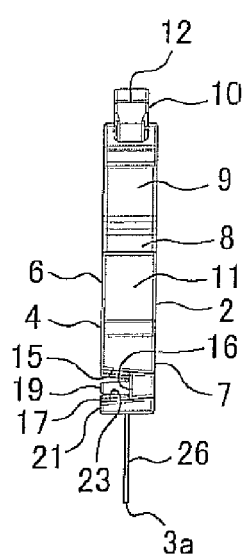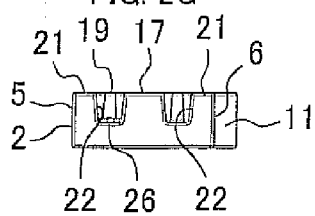

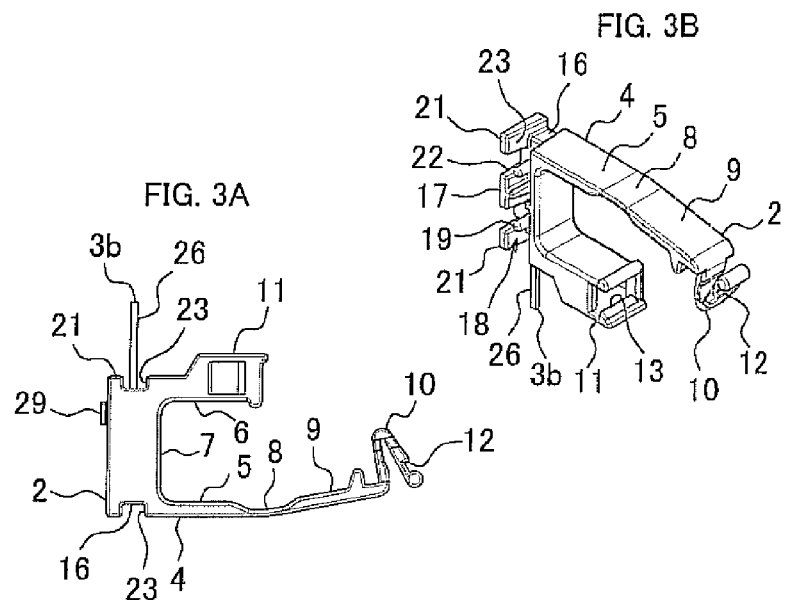
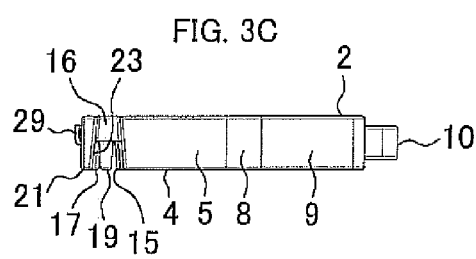
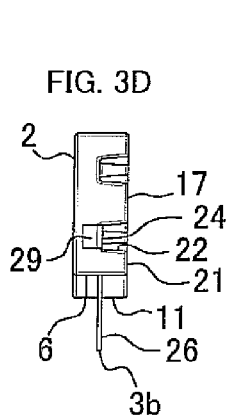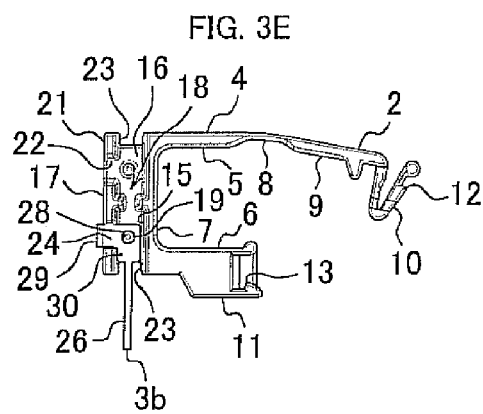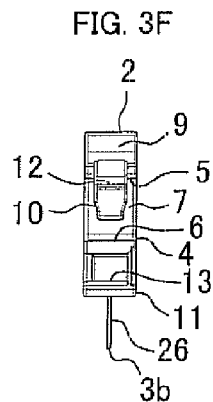
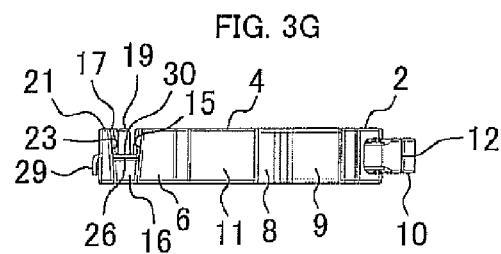

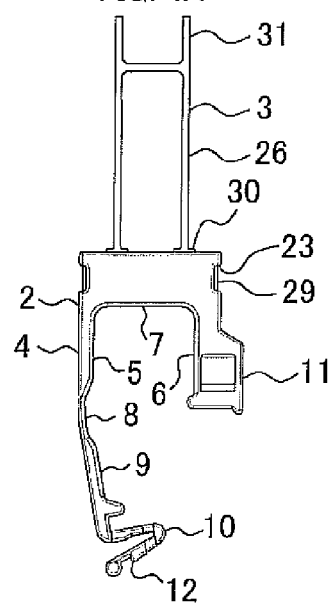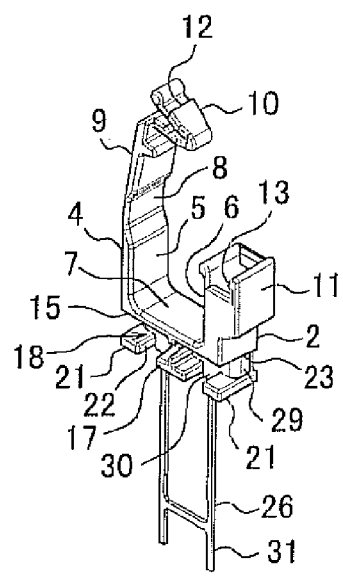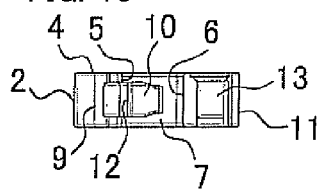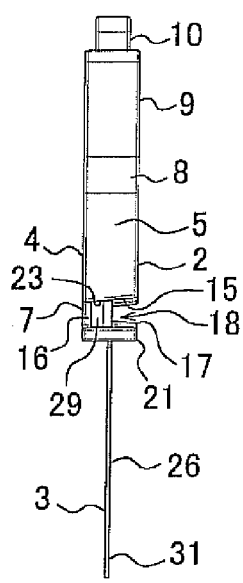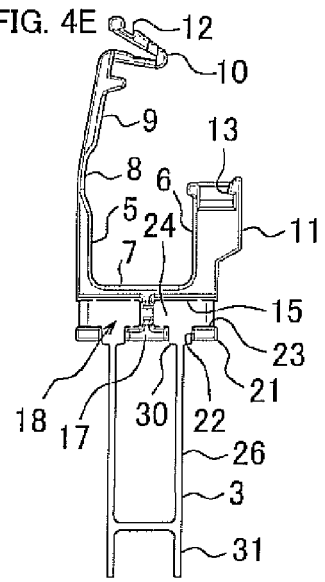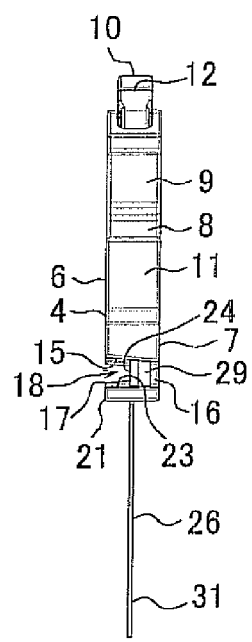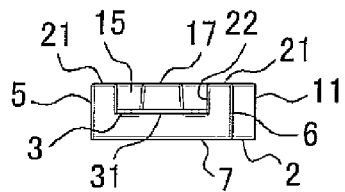

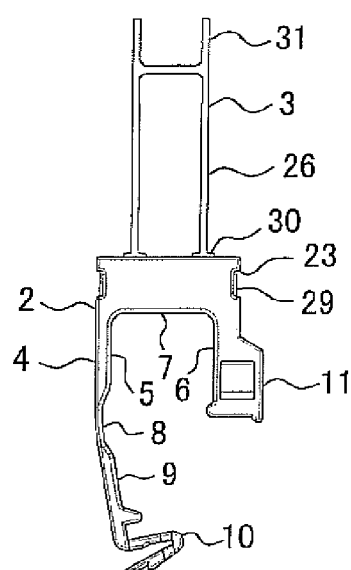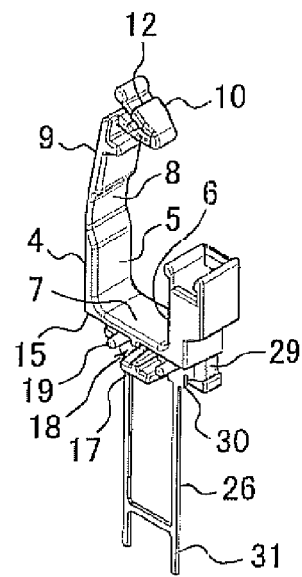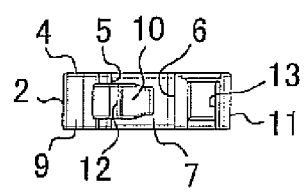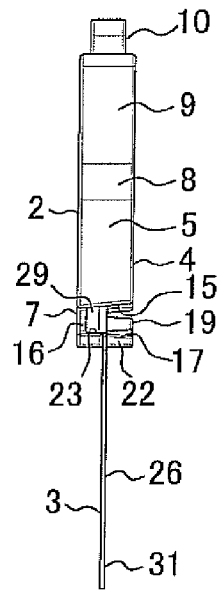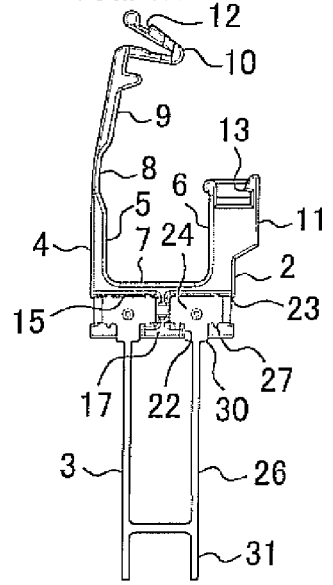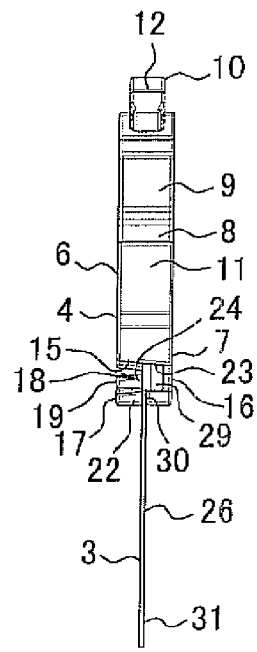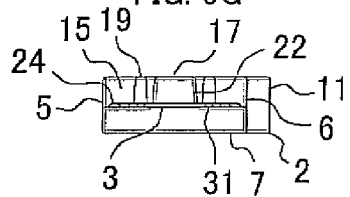

WIRE HOLDER

CROSS-REFERENCE TO RELATED APPLICATIONS

This application claims the benefit of Japanese Patent Application No. 2007-210287 filed in the Japan Patent Office on Aug. 10, 2007, the disclosure of which is incorporated herein by reference.

BACKGROUND

This invention belongs to a technical field of a wire holder which is mounted on a circuit board and holds a wire.

In an electronic device, a number of wires (here, wires include cable-shaped wires) are arranged, which are often arranged on a circuit board. A wire holder is used in order to determine a route of the wires arranged on the circuit board. For example, there is a taping wire clip described in Unexamined Japanese Patent Publication No. 2004-247357.

In the taping wire clip disclosed in the Unexamined Japanese Patent Publication No. 2004-247357, a synthetic resin component having a wire clip portion for holding wires is connected to a metal component having a lead portion to be inserted into holes provided on a circuit board. Upper ends of two legs of the lead portion are connected to form a fitting portion. A fitting recess portion which fits the fitting portion of the lead portion is provided in a base portion of a wire clip portion. The synthetic resin component and the metal component are connected by pushing the fitting portion into the fitting recess portion along a longitudinal direction of the lead portion so that the fitting portion fits the fitting recess portion.

SUMMARY

As described above, a taping wire clip disclosed in the Unexamined Japanese Patent Publication No. 2004-247357 has the structure in which the synthetic resin component and the metal component are connected by pushing the fitting portion into the fitting recess portion along the longitudinal direction of the lead portion so that the fitting portion fits the fitting recess portion. Accordingly, a projecting direction of the lead portion with respect to a wire clip portion is fixed. For this reason, it has been impossible to mount the wire clip portion on a circuit board in different positional relations with respect to the circuit board. It has been impossible to mount the clamp portion on a circuit board in a posture in which the wire clip portion is rolled sideways.

In one aspect of the present invention, a wire holder includes a synthetic resin component that includes a clamp portion for holding at least one wire and a metal component that includes at least one lead portion mounted on a circuit board. The synthetic resin component includes a groove-shaped fitting recess portion. The metal component includes at least one fitting portion that fits the fitting recess portion and is connected to the lead portion. The fitting recess portion includes at least one first opening portion which allows the at least one lead portion to project in a predetermined direction when the at least one fitting portion fits the fitting recess portion. At least one of end portions in an extension direction of a groove of the fitting recess portion is opened as a second opening portion which allows one of the at least one lead portion to project along the extension direction of the groove of the fitting recess portion.

In the wire holder configured as above, the metal component includes the fitting portion which fits the fitting recess portion and is connected to the lead portion. The fitting recess portion does not need to be directly connected to the lead portion, and the fitting recess portion and the lead portion may be connected through a portion corresponding to a base part of the lead portion.

Furthermore, in the wire holder configured as above, the synthetic resin component and the metal component are connected by fitting the fitting portion with the recess portion. For this reason, by projecting the lead portion from the first opening portion or the second opening portion, the synthetic resin component, that includes the clamp portion for holding at least one wire, and the metal component, that includes the lead portion, can be connected in different positional relations.

A structure of the clamp portion is not specifically limited. Examples of such structure include that, similar to the taping wire clip disclosed in Unexamined Japanese Patent Publication No. 2004-247357, the opening portion of the wire clip portion may include a locking claw that deforms elastically by a pushing-in operation of a wire so as to allow the wire to be pushed in, and that thereafter elastically restores to inhibit removal of the pushed-in wire. Alternatively, the clamp portion may be changeable between a closed ring state and an opening state.

The synthetic resin component may include a groove-shaped fitting recess portion which has a back wall, an upper wall connected thereto and a lower wall which is provided facing the upper wall and is connected to the back wall. The three walls of the back wall, the upper wall and the lower wall form the groove of the fitting recess portion, which, for example, may be divided into two right and left parts by a center part.

The first opening portion for allowing the lead portion to be projected (inserted) when the fitting portion fits the fitting recess portion may be provided at a lower wall side of the fitting recess portion. In this case, when the fitting portion fits the fitting recess portion, the lead portion projects from the first opening portion. Accordingly, the wire holder can be mounted on a circuit board by inserting the lead portion in at least one hole provided on the circuit board and fixing the same, for example, by flow soldering.

The first opening portion may allow the lead portion to project in a direction to be rotated by a prescribed angle with respect to the lead portion projected from the second opening portion around an axis perpendicular to the back wall. Also, even in this case, the wire holder can be mounted on a circuit board by inserting the lead portion projecting from the second opening portion in at least one hole provided on the circuit board and fixing the same, for example, by flow soldering.

Assuming that a posture of the clamp portion, when the wire holder is mounted on a circuit board by inserting the lead portion projecting from the first opening portion into a hole provided on the circuit board, is "erected", that of the clamp portion, when the wire holder is mounted on a circuit board with the lead portion projecting from the second opening portion, is "rolled sideways". In other words, the wire holder can be mounted on a circuit board in a posture in which the clamp portion is "erected" or "rolled sideways", depending on a state in which the lead portion projects from the first opening portion or the second opening portion.

The prescribed angle may be 90°. However, since the above effect can be obtained even if the angle is not exactly 90°, the prescribed angle is not limited as long as the clamp portion can be mounted on a circuit board in different postures.

The first opening portion may be structured so as to allow the lead portion to project in a direction which differs by a prescribed angle from a direction of the lead portion projecting from the second opening portion. The fitting recess portion may be structured such that a first side wall, which is one of a pair of side walls provided facing each other, is at a position farther from the damp portion than a second side wall, which is the other of the pair of side walls provided facing each other, and the first opening portion may be provided on the first side wall.

The first opening portion may be opened so that the lead portion projects in a direction orthogonal to the extension direction of the groove of the fitting recess portion. Also, the first opening portion may be structured such that the lead portion projects in parallel with the back wall which connects the pair of side walls provided facing each other of the fitting recess portion.

Both ends of the fitting recess portion may be structured so as to be opened as the second opening portion. The lead portion may be inserted in at least one hole provided on the circuit board so as to be mounted thereon.

The first opening portion may be formed with a same width as a groove width of the fitting recess portion. One of the fitting recess portion and the fitting portion may include a positioning pin, and the other thereof may include a pin hole capable of fitting the positioning pin.

BRIEF DESCRIPTION OF THE DRAWINGS

The invention will now be described below, by way of example, with reference to the accompanying drawings, in which:

FIG. 1A is a front view of a synthetic resin component in order to explain a wire holder of the present embodiment;

FIG. 1B is a front view of a metal component in order to explain the wire holder of the present embodiment;

FIGS. 1C, 1D, 1E, 1F, 1G, 1H and 1I are a rear view, a perspective view, a plan view, a left side view, a front view, a right side view and a bottom view, respectively, of the wire holder of the present embodiment;

FIGS. 2A, 2B, 2C, 2D, 2E, 2F and 2G are a rear view, a perspective view, a plan view, a left side view, a front view, a right side view and a bottom view, respectively, of the wire holder in order to explain Application 1 with one leg;

FIGS. 3A, 3B, 3C, 3D, 3E, 3F and 3G are a rear view, a perspective view, a plan view, a left side view, a front view, a right side view and a bottom view, respectively, of the wire holder in order to explain Application 2 with one leg;

FIGS. 4A, 4B, 4C, 4D, 4E, 4F and 4G are a rear view, a perspective view, a plan view, a left side view, a front view, a right side view and a bottom view, respectively, of the wire holder in order to explain Modified Forms 1 and 2;

FIGS. 5A, 5B, 5C, 5D, 5E, 5F and 5G are a rear view, a perspective view, a plan view, a left side view, a front view, a right side view and a bottom view, respectively, of the wire holder in order to explain Modified Forms 1 and 3.

DETAILED DESCRIPTION OF THE PREFERRED EMBODIMENT

Embodiment

Figure 6:
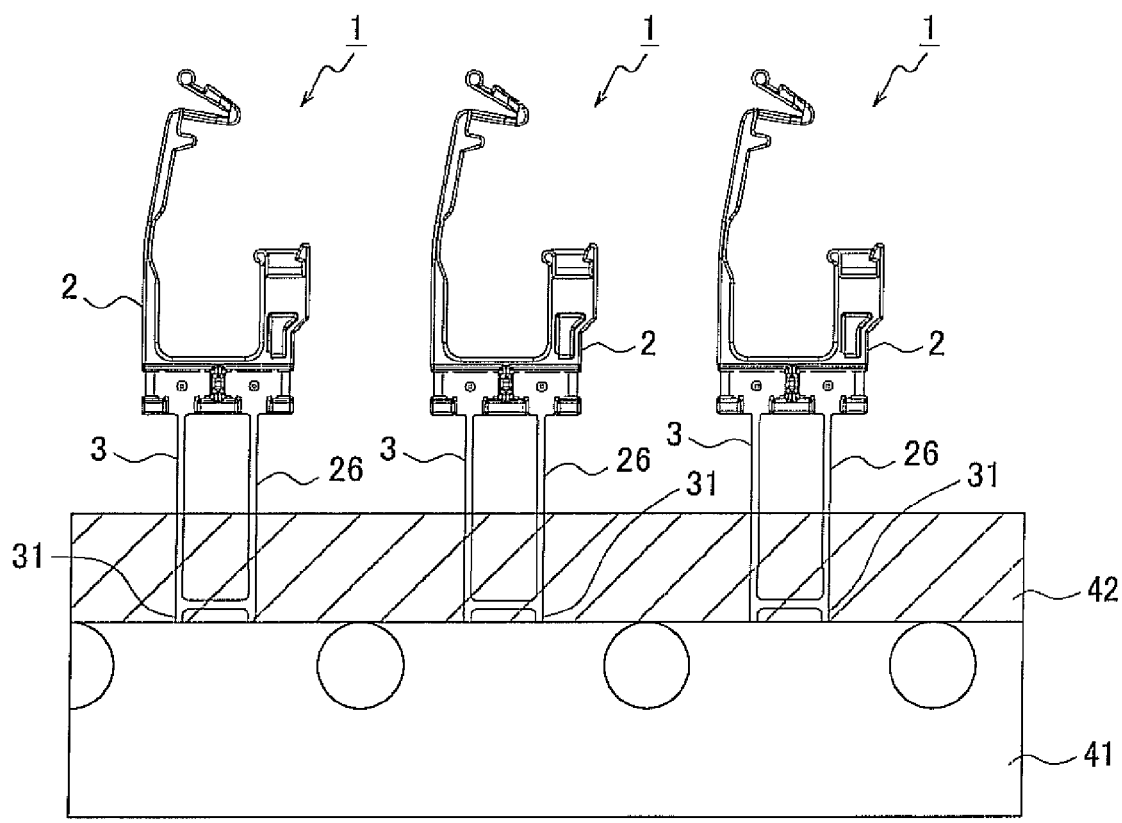
FIG. 6 is an explanatory view of a state in which the wire holder is adhered to a tape mount.

As shown in FIGS. 1A to 1I, a wire holder 1 of the present embodiment includes a synthetic resin component 2 which is molded with synthetic resin and a metal component 3 which is pressed from sheet metal.

A clamp portion 4 of the synthetic resin component 2 includes side walls 5 and 6 which faces each other, a base portion 7 which is laterally disposed between respective lower ends of the side walls 5 and 6, a movable portion 9 which is connected to an upper end portion of the side wall 5 via a hinge 8, a U-shaped locking portion 10 disposed to a tip of the movable portion 9, a box 11 connected to the side wall 6, or the like.

In an opening state shown in the figures, the side walls 5 and 6 and the base portion 7 forms a U-shaped structure, and there is an opening space between the movable portion 9 (the locking portion 10) and the side wall 6 (the box 11).

On the other hand, when the movable portion 9 is bent by the hinge 8 so that the locking portion 10 is inserted into the box 11, a stepped portion 12 of the locking portion 10 is locked to a locking protrusion 13 of the box 11 so that the locking portion 10 is restricted in the box 11. Accordingly, a substantially rectangular closed ring is formed in the clamp portion 4. At least one wire can be held by the closed ring. In the present application, wires include cable-shaped wires.

The base portion 7 has a structure for connecting the synthetic resin component 2 and the metal component 3.

In other words, the base portion 7 includes the groove-shaped fitting recess portion 18. The fitting recess portion 18 includes an upper wall 15, a back wall 16 and a lower wall 17. The upper wall 15 constitutes a lower end portion of the U-shaped structure or the closed ring as described above. The back wall 16 is connected to one side of the upper wall 15 and extends downward. The lower wall 17 is connected to a lower end portion of the back wall 16 so as to face the upper wall 15.

The fitting recess portion 18 includes a narrow part with a narrowed groove width in a center part. The fitting recess portion 18 is divided into two right and left parts which include fitting pins 19 in a standing manner on the back wall 16.

On the other hand, end walls 21 are provided in the right and left of the lower wall 17, and first opening portions 22 are formed between the lower wall 17 and the end walls 21. Furthermore, second opening portions 23 are opened between the end walls 21 and the upper wall 15 (i.e., at both ends in an extension direction of a groove of the fitting recess portion 18).

The metal component 3 includes a pair of main fitting portions 24, a relay portion 25 which relays between the pair of main fitting portions 24, and lead portions 26 connected to the main fitting portions 24.

As shown in FIG. 1B, the width, in a vertical direction, of the main fitting portions 24, is approximately the same as a groove width of the fitting recess portion 18 (an interval between the upper wall 15 and the lower wall 17, or between the upper wall 15 and the end walls 21). The main fitting portions 24 fit the fitting recess portion 18.

Removal preventive strips 27 extend from upper and lower edges of the main fitting portions 24. When the main fitting portions 24 fit the fitting recess portion 18, these removal preventive strips 27 are in a state that the main fitting portions 24 bite into the upper wall 15, the lower wall 17 and the end walls 21 so as to inhibit removal of the main fitting portions 24.

In addition, the main fitting portions 24 include pin holes 28 respectively which correspond to the fitting pins 19. When the main fitting portions 24 fit the fitting recess portion 18, the fitting pins 19 fit the pin holes 28.

Furthermore, horizontal ends of the main fitting portions 24 are bent approximately at a right angle to form lateral fitting portions 29. The lateral fitting portions 29, when the main fitting portions 24 fit the fitting recess portion 18, is fit between the upper wall 15 and the end walls 21.

The lead portions 26 are connected to the main fitting portions 24 respectively via sub-fitting portions 30. When the main fitting portions 24 fit the fitting recess portion 18, the sub-fitting portions 30 fit the first opening portions 22 respectively.

The metal component 3 includes tape sticking portion 31 which is connected to the lead portions 26. As shown in FIG. 6, the tape sticking portion 31 is used for sticking, with a sticking tape 42, the wire holder 1 on a tape mount 41. The tape mount 41 is used in a mounting machine for mounting the wire holder 1 on a circuit board. In FIG. 6, hatching is applied in order to clearly show the sticking tape 42, and a perspective view is presented in order to show a state in which the wire holders 1 are stuck on the tape mount 41 using the lead portions 26 and the tape sticking portions 31. In mounting of the wire holders 1, the lead portions 26 are cut at an appropriate length (for example, in a vicinity of a region shown by a virtual line in FIG. 1E.), to be separated from the tape sticking portion 31.

With the above structure, the wire holder 1 may be mounted on a circuit board by inserting the lead portions 26 projecting from the first opening portions 22 into holes provided on the circuit board so as to be fixed thereon by flow soldering.

Since the wire holder 1 includes the second opening portions 23, the lateral fitting portions 29 may be inserted between the upper wall 15 and the end walls 21 while being in contact with end surfaces of the back wall 16 respectively. The lateral fitting portions 29 inhibit shaking of the metal component 3 or inclination of the lead portions 26. In other words, by the lateral fitting portions 29, a projecting direction of the lead portions 26 is made more accurate, and linkage between the synthetic resin component 2 and the metal component 3 is ensured.

[Application 1 with One Leg]

As shown in FIGS. 2A to 2G, a metal component 3a includes one main fitting portion 24, one sub fitting portion 30 and one lead portion 26. With the above mentioned structure, even if the metal component 3a is used, linkage between the synthetic resin component 2 and the metal component 3a is ensured and the projecting direction of the lead portion 26 is accurately maintained.

Accordingly, even in a part where there is not space enough to fix two lead portions 26 in a vicinity of a frame part of the circuit board, the wire holder can be mounted on a circuit board with one lead portion 26.

[Application 2 with One Leg]

Also, since the second opening portions 23 are provided, an embodiment shown in FIGS. 3A to 3G is possible. A metal component 3b shown in FIGS. 3A to 3G includes, similar to the metal component 3a in FIGS. 2A to 2G, one main fitting part 24, one sub-fitting portion 30 and one lead portion 26.

However, since a fixing posture (a projecting direction of the lead portion 26) is different from that in the above embodiment, a part of the main fitting portion 24 fits a first opening portion 22, and a lateral fitting portion 29 is in contact with an outer surface of a lower wall 17. Furthermore, the remaining part of the main fitting portion 24 and the sub-fitting portion 30 fit the fitting recess portion 18, and the lead portion 26 projects from the second opening portion 23. In other words, the projecting direction of the lead portion 26 here is changed by 90° from that of Application 1 as shown in FIGS. 2A to 2G.

Although Application 2 is similar to Application 1, in that the wire holder can be mounted on a circuit board with one lead portion 26, a posture of the clamp portion 4 is different between Applications 1 and 2. In Application 1 as shown in FIGS. 2A to 2G, the clamp portion 4 stands upright. On the other hand, in Application 2 as shown in FIGS. 3A to 3G, in which the lead portion 26 projects from the second opening portion 23, the clamp portion 4 is rolled sideways.

That is, the clamp portion 4 may be mounted on a circuit board in an upright-standing or rolled-sideways posture, depending on a state in which the lead portion 26 is projected from the first opening portion 22 or the second opening portion 23.

[Modified Form 1]

As shown in FIGS. 4A to 4G and FIGS. 5A to 5G, the relay portion 25 may be omitted and the two main fitting portions 24 may be separated.

[Modified Form 2]

Also, as shown in FIGS. 4A to 4G, the fitting pins 19 may be omitted. In this case, even if the pin holes 28 are provided, no inconvenience is caused. However, the pin holes 28 may also be omitted as shown in FIGS. 4A to 4G.

[Modified Form 3]

Alternatively, as shown in FIGS. 5A to 5G, the end walls 21 may be omitted. In this case, although the first opening portions 22 and the second opening portions 23 are combined with each other, the main fitting portions 24 can fit the fitting recess portion 18 without problem.

As described above, the invention is not limited to the above-mentioned embodiment and can be embodied by various modifications within the scope of a gist of the invention.

For example, in the synthetic resin component 2 of the above embodiment, the width of the first opening portions 22 and the width of the second opening portions 23 (i.e., the groove width of both ends of the fitting recess portion 18) may be the same. Also, the widths of the main fitting portions 24 and the sub-fitting portion 30 may be the same. Accordingly, with one kind of metal component 3a, the wire holder 1 can be mounted on a circuit board in a posture that the clamp portion 4 stands upright or is rolled sideways.

Also, in the above embodiment, the fitting recess portion 18 is provided on the base portion 7 of the synthetic resin component 2. However, the fitting recess portion 18 is not necessarily provided on the base portion 7. For example, the fitting recess portion 18 may be provided on the side wall 5 or the side wall 6.

Also, in the above embodiment, for example, the first opening portions 22 are provided between the lower wall 17 and the end walls 21 of the fitting recess portion 18. However, the first opening portions 22 may be provided in the same direction as the second opening portion 23. Furthermore, the first opening portion may be provided on one end of the groove-shaped fitting recess portion 18 and the second opening portion may be provided on the other end thereof.

In the above embodiment, the fitting pins 19 are provided on the back wall 16 of the fitting recess portion 18, and the pin holes 28 which fit the fitting pins 19 are provided on the main fitting portions 24. However, the fitting pins 19 may be on the main fitting portions 24 and the pin holes 28 may be provided on the back wall 16.

What is claimed is:

1. A wire holder comprising:
   a synthetic resin component that includes a clamp portion for holding at least one wire; and
   a metal component that includes at least one lead portion mounted on a circuit board, wherein
   the synthetic resin component comprises a groove-shaped fitting recess portion;
   the metal component comprises at least one fitting portion that fits the fitting recess portion and is connected to the lead portion;
   the fitting recess portion comprises at least one first opening portion which allows the at least one lead portion to project in a predetermined direction when the at least one fitting portion fits the fitting recess portion;

at least one of end portions is an extension direction of a groove of the fitting recess portion is opened as a second opening portion which allows one of the at least one lead portion to project along the extension direction of the groove of the fitting recess portion.

2. The wire holder according to claim 1, wherein the fitting recess portion is provided below the clamp portion, and comprises a back wall, an upper wall connected to the back wall and a lower wall provided facing the upper wall and connected to the back wall; and the first opening portion is provided on the lower wall side.

3. The wire holder according to claim 2, wherein the first opening portion allows the lead portion to project in a direction to be rotated by a prescribed angle with respect to the lead portion projected from the second opening portion around an axis perpendicular to the back wall.

4. The wire holder according to claim 3, wherein the prescribed angle is 90 degrees.

5. The wire holder according to claim 1, wherein the first opening portion allows the lead portion to project in a direction which differs by a prescribed angle from a direction of the lead portion projecting from the second opening portion.

6. The wire holder according to claim 1, wherein the fitting recess portion is structured such that a first wall, which is one of a pair of side walls provided facing each other, is at a position farther from the clamp portion than a second side wall, which is the other of the pair of side walls provided facing each other; and the first opening portion is provided on the first side wall.

7. The wire holder according to claim 1, wherein the first opening portion is opened so as to allow the lead portion to project in a direction orthogonal to the extension direction of the groove of the fitting recess portion.

8. The wire holder according to claim 1, wherein the first opening portion is structured so as to allow the lead portion to project in parallel with a back wall which connects a pair of side walls provided facing each other of the fitting recess portion.

9. The wire holder according to claim 1, wherein both ends of the fitting recess portion are opened as the second opening portion.

10. The wire holder according to claim 1, wherein the lead portion is inserted into at least one hole provided to the circuit board so as to be mounted thereon.

11. The wire holder according to claim 1, wherein the first opening portion is formed with a same width as a groove width of the fitting recess portion.

12. The wire holder according to claim 1, wherein one of the fitting recess portion and the fitting portion includes a positioning pin, and the other thereof includes a pin hole capable of fitting the positioning pin.

* * * * *